US012628314B2

(12) United States Patent
Wang et al.

(10) Patent No.: US 12,628,314 B2
(45) Date of Patent: May 12, 2026

(54) INTEGRATED HEAT DISSIPATION MODULE STRUCTURE

(71) Applicant: TOP RANK TECHNOLOGY LIMITED, Apia (WS)

(72) Inventors: Tien-Lai Wang, Apia (WS); Tzu-Yu Wang, Apia (WS); Cheng-Yu Wang, Apia (WS); Meng-Yu Lee, Apia (WS)

(73) Assignee: TOP RANK TECHNOLOGY LIMITED, Apia (WS)

( * ) Notice: Subject to any disclaimer, the term of this patent is extended or adjusted under 35 U.S.C. 154(b) by 257 days.

(21) Appl. No.: 18/142,115

(22) Filed: May 2, 2023

(65) Prior Publication Data

US 2024/0298425 A1 Sep. 5, 2024

(30) Foreign Application Priority Data

Mar. 1, 2023 (TW) .................................. 112107211

(51) Int. Cl.
*H05K 7/20* (2006.01)
*F28D 15/04* (2006.01)
*F28D 15/02* (2006.01)

(52) U.S. Cl.
CPC ....... *H05K 7/20336* (2013.01); *F28D 15/046* (2013.01); *F28D 15/0283* (2013.01)

(58) Field of Classification Search
CPC .............. H05K 7/20336; F28D 15/046; F28D 15/0283
USPC .................................................... 165/104.26
See application file for complete search history.

(56) References Cited

U.S. PATENT DOCUMENTS

| | | | | |
|---|---|---|---|---|
| 6,874,568 B2 * | 4/2005 | Lai | ...................... | H01L 23/4006 |
| | | | | 165/80.4 |
| 2003/0155102 A1 * | 8/2003 | Garner | .................. | H01L 23/427 |
| | | | | 165/185 |
| 2009/0025910 A1 * | 1/2009 | Hoffman | ............... | F28D 15/046 |
| | | | | 165/104.21 |
| 2016/0209123 A1 * | 7/2016 | Yee | ...................... | F28D 15/0233 |
| 2016/0345463 A1 * | 11/2016 | Matsumoto | ......... | H01L 23/3677 |
| 2020/0404802 A1 * | 12/2020 | Takahashi | .................. | B32B 3/30 |
| 2023/0213288 A1 * | 7/2023 | Wang | ........................ | F28F 3/02 |
| | | | | 165/104.26 |

* cited by examiner

*Primary Examiner* — Joel M Attey
(74) *Attorney, Agent, or Firm* — WPAT, PC

(57) ABSTRACT

An integrated heat dissipation module structure includes a metallic top cover, a metallic bottom cover, a working space, capillary structures and a working fluid in the working space. The top cover includes oppositely an outer heat-dissipating surface having a plurality of columnar heat dissipation structures protruding therefrom and an inner condensation surface surrounded by a top frame. The inner condensation surface has parallel top grooves. The bottom cover includes oppositely an outer heat-absorption surface having screw holes for locking electronic elements and an inner evaporation surface surrounded by a bottom frame. The inner evaporation surface has parallel bottom grooves, protrusive supporting structures disposed between the bottom grooves, and screw-hole protrusions corresponding to the screw holes. The capillary structures are disposed within the bottom grooves or both the bottom and top grooves. The working fluid is in the working space and the capillary structures.

17 Claims, 7 Drawing Sheets

INTEGRATED HEAT DISSIPATION MODULE STRUCTURE

CROSS REFERENCE TO RELATED APPLICATION

This application claims the benefits of Taiwan application Serial No. 112107211, filed Mar. 1, 2023, the disclosures of which are incorporated by references herein in its entirety.

TECHNICAL FIELD

The present disclosure relates in general to a heat dissipation module structure, and more particularly to an integrated heat dissipation module structure.

BACKGROUND

High-power electronic components are new-generation of semiconductor components, especially in the fields of high-speed rail transportation, smart grids or electric vehicles, and have gradually become the mainstream of the applications. For example, an insulated gate bipolar transistor (or IGBT) is used in high-frequency and high-power fields because of its low driving voltage, good ability to withstand high voltage, and high switching frequency. However, the operation of high-power electronic components is inevitably accompanied by the generation of a large amount of heat due to their high power density. If the heat accumulated in the power components cannot be dissipated effectively and in a timely manner, the reliability of electronic components will be greatly affected, which restricts the development of its application.

Traditionally, the structure of a heat dissipation module for power elements or chips, such as IBGT/diode, regularly has the power elements or chips welding on one surface of a ceramic substrate covered with metal layers on both sides. The commonly used material of the ceramic substrate are aluminum oxide and aluminum nitride. The metal layers on the substrate are mainly used for fabricating circuit layout, heat conduction and heat dissipation. The other side of the ceramic substrate is welded to one surface of a copper base plate through solder, and the other surface of the copper base plate is then coated with a layer of heat-conducting paste or heat-conducting silicone grease and bonded to a heat sink.

When the power components are in operation, a large amount of heat will be simultaneously generated. In the power module with this heat dissipation structure, the generated large amount of heat will be transmitted to the copper base plate through the ceramic substrate. Then, through the thermal conductive paste or thermal grease, the heat will be further transmitted to the heat sink, and rapidly dissipated. However, because of the insufficient heat conduction efficiency of thermal conductive paste or thermal grease, the generated heat cannot be efficiently transferred from the copper base plate to the heat sink and dissipated. It is then accumulated in the copper base plate, resulting in temperature rising. Because of the great difference in thermal expansion coefficient between the ceramic substrate and the copper base plate, the rising temperature will result in different degrees of distortion for the ceramic substrate and copper base plate, making their welding interface being destroyed. The heat conduction is thus hindered, eventually leading the whole component overtemperature and failure.

In view of the above problems, industries like Semikron have developed another heat dissipation module, which removes the copper base plate, and allows the ceramic substrate assembled with power components or chips directly bonds to the heat sink through thermal paste or thermal grease. Thus, it can therefore avoid abnormalities caused by differences in thermal expansion coefficients. However, due to the difficulty of processing and the physical properties of the material, most of the heat sink makers use aluminum or aluminum alloys as materials, and adopt extrusion processing to produce heat sinks. It should be noted that the thermal diffusivity of aluminum or aluminum alloy is much smaller than that of copper. Hence, when the small-volume power components rapidly generate great amounts of heat in one spot area, the heat will not spread efficiently to the entire heat sink without the rapid lateral diffusion of the copper base plate. This will make the heat sink unable to exert its maximum heat dissipation efficiency with maximum area.

In another heat dissipation module, in order to quickly spread the great amount of high dense, rapidly generated heat to a larger area on the heat sink, the industry replaces the copper base plate with a copper vapor chamber. One surface of the ceramic substrate is welded with heat-generating power elements while the other surface of that is directly welded or bonded on to the heat absorbing surface of a vapor chamber. The heat sink is pasted on the heat dissipation surface of the vapor chamber through thermal paste. When a large amount of heat is rapidly generated from the power element and transferred to the vapor chamber, the working fluid existing in the working space of the vapor chamber will quickly absorb the heat and quickly vaporize into steam. The heat dissipation surface of the vapor chamber is connected to a heat sink, thus when the steam rises rapidly and touches the cold heat dissipation surface connected to the heat sink, the steam will immediately condense into a working fluid. By this rapid phase transformation cycle, a large amount of heat is absorbed and then released in a fast and effective way. Compare with the copper base plate used in the conventional module, the vapor chamber can spread a large amount of high-dense heat source to a larger area of the heat sink more quickly, and, as a result, possesses a more effective heat dissipation.

As one of the advanced heat dissipation methods currently, the vapor chamber uses the fast phase transformation of a working fluid in a closed working chamber to dissipate heat rapidly. Through the latent heat transfer involved in the rapid vaporization and condensation process of the working liquid in the near-vacuum chamber (i.e., the closed working chamber), the purpose of rapid cooling can be achieved. Empirically, heat conduction efficiency of the vapor chamber can reach higher than 10,000 W/(m2·° C.), namely dozens of times the heat conduction efficiency of a traditional air convection or liquid convection. When the heat sink is attached onto the vapor chamber in the above-mentioned heat dissipation module, the thermal paste coated between the vapor chamber and the heat sink becomes great thermal resistance, and thus the high thermal conductivity of the vapor chamber cannot be effectively utilized.

In view of the above problems, the inventor of the present disclosure proposes an integrated heat dissipation module structure. More specifically, it is a more efficient heat dissipation module structure that integrates the heat sink and the vapor chamber into one. To explain, the integrated heat dissipation module structure disclosed in this disclosure is manufactured by integrating the heat dissipation structure of the heat sink and the metallic top cover of the vapor chamber with the same metal plate (or block). The thermal resistance originated from the low thermal conductivity thermal paste disposed between the vapor chamber and heat sink is thereby eliminated to improve the heat dissipation efficiency. In addition, because of the improvement of heat dissipation efficiency, the deformation caused by thermal stress between the ceramic substrate and the vapor chamber will also be effectively prevented. The integrated heat dissipation module structure proposed in this disclosure integrates the heat sink and the vapor chamber as a unique piece, eliminating the interface between the heat sink and the vapor chamber, and thus also eliminate the thermal resistance originated from the thermal paste. In addition, the integrated heat dissipation module structure disclosed in this disclosure provides a screw hole to directly lock the power components or ceramic substrates on the heat absorbing surface of the vapor chamber. Without passing through a low thermal conductivity media such as thermal paste, the thermal resistance existed between the heat source and the heat dissipation module is eliminated and the heat dissipation efficiency is improved.

The integrated heat dissipation module structure in this disclosure can be produced not only by processing methods such as pressing, extrusion, milling machining, casting, forging, etc., but also can be produced by cold-forging method on a metal plate/block (such as copper). The cold-forging process requires no preheating and annealing steps of a typical forging or pressing process, thus, it is characterized that the thermal conductivity of the forged metal will not be reduced since the internal grain structure of the forged metal will not exist holes/voids and hypertrophy caused by the annealing.

SUMMARY

In one embodiment of this disclosure, an integrated heat dissipation module structure includes a metallic top cover, a metallic bottom cover, a working space, a vacuum channel, a plurality of capillary structures and a working fluid. The metallic top cover includes oppositely an outer heat-dissipating surface and an inner condensation surface. The outer heat-dissipating surface has a plurality of columnar heat dissipation structures protruding therefrom. The inner condensation surface is surrounded by a top frame with a predetermined height, and the top frame is furnished with an upper communicative groove. The inner condensation surface has thereon a plurality of top grooves parallel to each other. The metallic bottom cover includes oppositely an outer heat-absorption surface and an inner evaporation surface. The outer heat-absorption surface has thereon a screw hole for locking at least one heat-generating element. The inner evaporation surface is surrounded by a bottom frame with another predetermined height, and the bottom frame is furnished with a lower communicative groove. The inner evaporation surface has thereon a plurality of bottom grooves parallel to each other, a plurality of supporting structures protruding therefrom and disposed between the bottom grooves, and a screw-hole protrusion corresponding to the screw hole. The screw-hole protrusion is formed by recessing from the outer heat-absorption surface to the inner evaporation surface and protruding from the inner evaporation surface but not penetrating through. The height of the screw-hole protrusion is not higher than the height of the supporting structures. The working space is an airtight space formed by engaging the top frame of the metallic top cover and the bottom frame of the metallic bottom cover with the inner condensation surface of the metallic top cover to face the inner evaporation surface of the metallic bottom cover and the plurality of top grooves to overlap individually the plurality of bottom grooves. The plurality of supporting structures are protruding from the inner evaporation surface to contact individually at the inner condensation surface among the plurality of top grooves and providing support to the working space. The vacuum channel is formed by connecting spatially the upper communicative groove and the lower communicative groove so as provide a channel for vacuuming the working space. The plurality of capillary structures are disposed individually inside the plurality of bottom grooves or both top and bottom grooves. The working fluid is in the working space and the plurality of capillary structures.

In one embodiment of this disclosure, an integrated heat dissipation module structure includes a metallic top cover, a metallic bottom cover, a working space, a vacuum channel, a plurality of capillary structures and a working fluid. The metallic top cover includes oppositely an outer heat-dissipating surface and an inner condensation surface. The outer heat-dissipating surface has a plurality of columnar heat dissipation structures protruding therefrom. The inner condensation surface is surrounded by a top frame with a predetermined height, and the top frame is furnished with an upper communicative groove. The inner condensation surface has thereon a plurality of top grooves parallel to each other. The metallic bottom cover includes oppositely an outer heat-absorption surface and an inner evaporation surface. The outer heat-absorption surface has thereon a plurality of screw holes for locking multiple heat-generating elements. The inner evaporation surface is surrounded by a bottom frame with another predetermined height, and the bottom frame is furnished with a lower communicative groove. The inner evaporation surface has thereon a plurality of bottom grooves parallel to each other and a plurality of screw-hole protrusions corresponding to the plurality of screw holes. The plurality of screw-hole protrusions are formed by recessing from the outer heat-absorption surface to the inner evaporation surface and protruding from the inner evaporation surface but not penetrating through. The working space is an airtight space formed by engaging the top frame of the metallic top cover and the bottom frame of the metallic bottom cover with the inner condensation surface of the metallic top cover to face the inner evaporation surface of the metallic bottom cover and the plurality of top grooves to overlap individually the plurality of bottom grooves. The plurality of screw-hole protrusions are protruding from the inner evaporation surface to contact individually at the inner condensation surface and providing support to the working space. The vacuum channel is formed by connecting spatially the upper communicative groove and the lower communicative groove so as provide a channel for vacuuming the working space. The plurality of capillary structures are disposed individually inside the plurality of bottom grooves or both top and bottom grooves. The working fluid is in the working space and the plurality of capillary structures.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
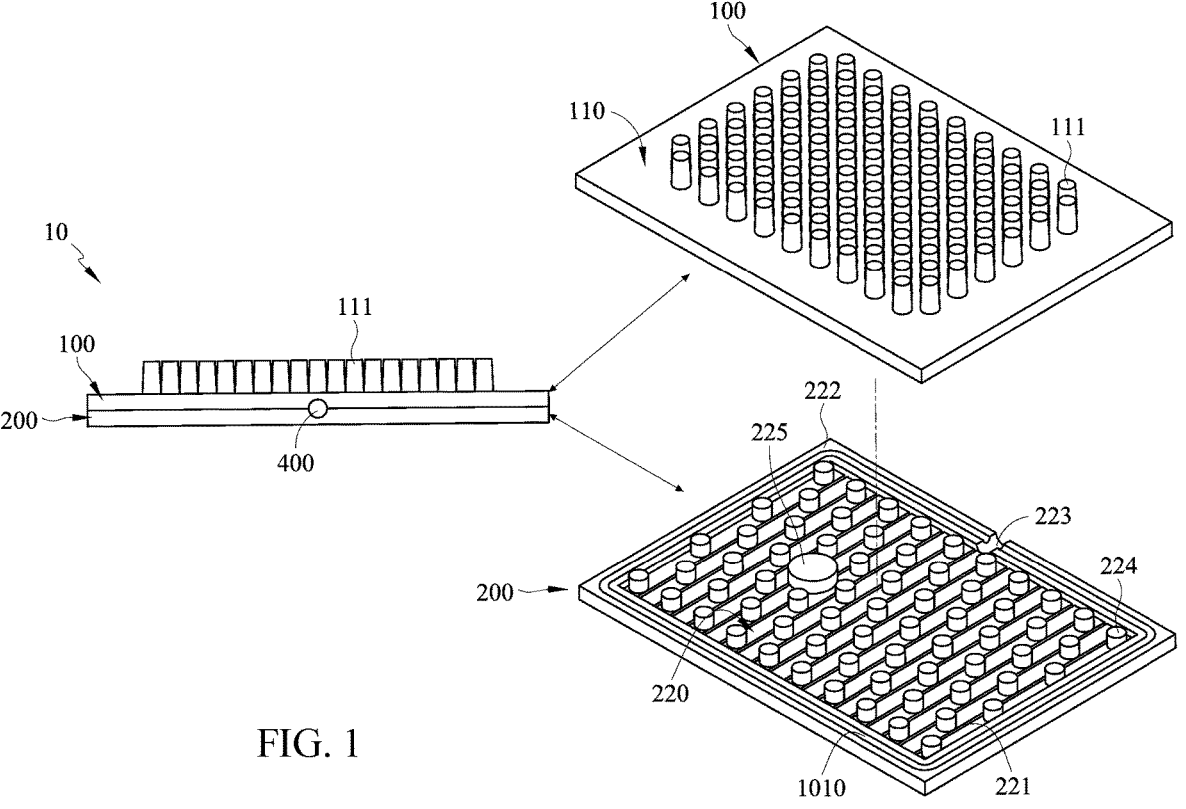
FIG. 1 shows schematically an embodiment of the integrated heat dissipation module structure in accordance with this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. In the following description and/or scope of patent application, the technical terms used should be interpreted with the usual meanings commonly used by those skilled in the art. For ease of understanding, the same elements in the following embodiments are referred to as the same symbols. In this specification, the term "about" usually means that the actual value is within plus or minus 10%, 5%, 1% or 0.5% of a specific value or range. The term "about" herein means also that the actual value falls within an acceptable standard error of the mean, as considered by one of ordinary skill in the art to which this invention pertains. Except for the examples, or unless otherwise expressly stated, it should be understood that ranges, amounts, values and percentages used herein are modified by "about". Therefore, unless otherwise stated, the numerical values or parameters disclosed in this specification and the appended patent claims are approximate numerical values and may be changed as required.

Referring to FIG. 1 to FIG. 4, an embodiment of an integrated heat dissipation module structure 10 in accordance with this disclosure includes a metallic top cover 100, a metallic bottom cover 200, a working space 300, a vacuum channel 400, a plurality of capillary structures 500 and a working fluid. The metallic top cover 100 further includes oppositely an outer heat-dissipating surface 110 and an inner condensation surface 120. The outer heat-dissipating surface 110 has a plurality of columnar heat dissipation structures 111 protruding therefrom. The inner condensation surface 120 is surrounded by a top frame 122 with a predetermined height, and the top frame 122 is furnished with an upper communicative groove 123. The inner condensation surface 120 has thereon a plurality of top grooves 121 parallel to each other. The metallic bottom cover 200 includes oppositely an outer heat-absorption surface 210 and an inner evaporation surface 220. The outer heat-absorption surface 210 has thereon a screw hole 211 for locking at least one heat-generating element. The inner evaporation surface 220 is surrounded by a bottom frame 222 with another predetermined height, and the bottom frame 222 is furnished with a lower communicative groove 223. The inner evaporation surface 220 has thereon a plurality of bottom grooves 221 parallel to each other, supporting structures 224 protruding thereon disposed between the bottom grooves 221, and a screw-hole protrusion 225 corresponding to the screw hole 211. The screw-hole protrusion 225 is formed by recessing from the outer heat-absorption surface 210 to the inner evaporation surface 220 and protruding from the inner evaporation surface 220 but not penetrating through. The height of the screw-hole protrusion 225 is not higher than the height of the supporting structures 224. The working space 300 is an airtight space formed by engaging the top frame 122 of the metallic top cover 100 and the bottom frame 222 of the metallic bottom cover 200 with the inner condensation surface 120 of the metallic top cover 100 to face the inner evaporation surface 220 of the metallic bottom cover 200 and the plurality of top grooves 121 to overlap individually the plurality of bottom grooves 221. The plurality of supporting structures 224 are protruding from the inner evaporation surface 220 to contact individually at the inner condensation surface 120 among the plurality of top grooves 121 and providing support to the working space 300. The vacuum channel 400 is formed by connecting spatially the upper communicative groove 123 and the lower communicative groove 223 so as provide a channel for vacuuming the working space 300. The plurality of capillary structures 500 are disposed individually inside the plurality of bottom grooves 221 or both top grooves 121 and bottom grooves 221. The working fluid is in the working space 300 and the plurality of capillary structures 500.

In one embodiment of this disclosure, the top frame 122 and the bottom frame 222 of the integrated heat dissipation module structure 10 further include individual welding grooves 1010 for welding the metallic top cover 100 and the metallic bottom cover 200 to form the integrated heat dissipation module structure 10 of the present disclosure.

Figure 2:
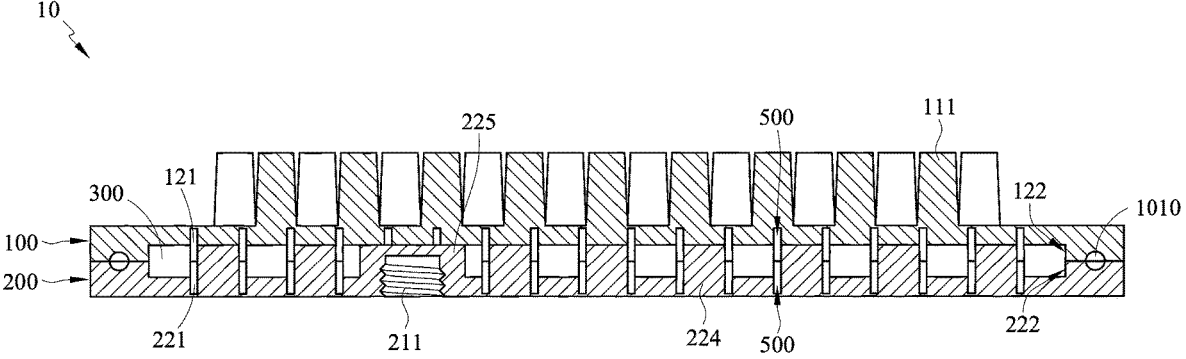
FIG. 2 shows schematically a cross-sectional view of an embodiment of the integrated heat dissipation module structure in accordance with this disclosure.
Figure 3:
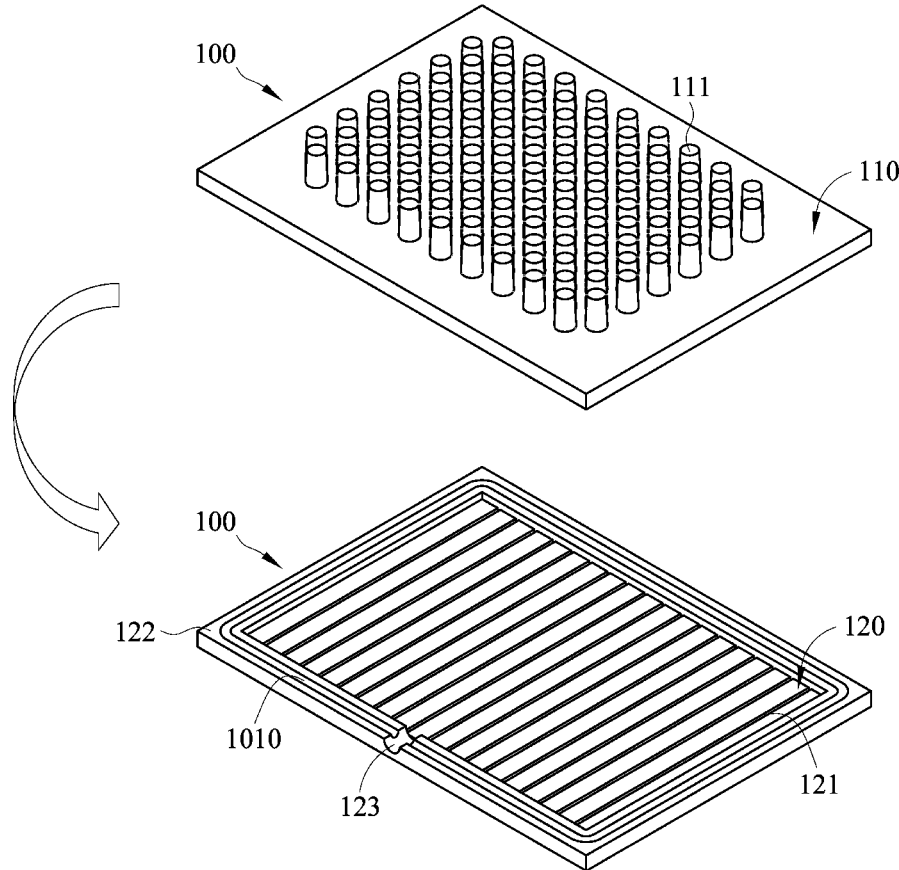
FIG. 3 shows schematically a metallic top cover of an embodiment of the integrated heat dissipation module structure in accordance with this disclosure.

Referring to FIG. 2 and FIG. 3, the metallic top cover 100 for the integrated heat dissipation module structure 10 is schematically shown. In this embodiment, the integrated heat dissipation module structure 10 is characterized in which the conformation and structure features of the metallic top cover 100 are directly formed on the same piece of metal. Namely, the columnar heat dissipation structures 111 on the metallic top cover 100 and the shape of the metallic top cover 100 are all directly formed, as a unique piece, from the same metal body, not by re-sintering or welding. In other words, in this embodiment of the present disclosure, the plurality of columnar heat dissipation structures 111 included on the outer heat-dissipating surface 110 of the metallic top cover 100 of the integrated heat dissipation module structure 10 are directly formed on the outer heat-dissipating surface 110 without having any homogeneous or heterogeneous interfaces in between. In contrast to the regular prior arts, which the heat sink is pasted on the heat-dissipating surface of the vapor chamber by the heat dissipation paste, or the heat dissipation structures are formed on the heat on the heat-dissipating surface of the vapor chamber by welding or sintering. Comparing with the prior arts, in the integrated heat dissipation module structure 10 of the present disclosure, the columnar heat dissipation structures 111 are directly formed on the metallic top cover 100 of the vapor chamber, thereby, the heterogeneous interface and its heat resistance between the heat sink and the vapor chamber can be eliminated, and thus the heat-dissipating efficiency is improved.

Figure 4:
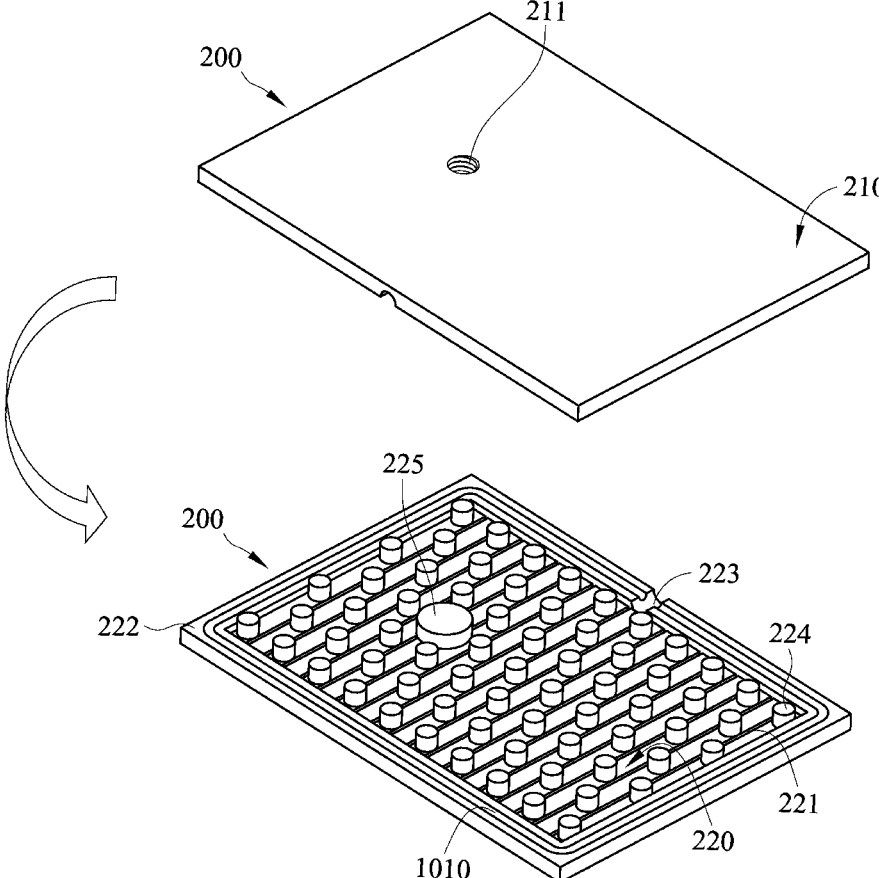
FIG. 4 shows schematically a metallic bottom cover of an embodiment of the integrated heat dissipation module structure in accordance with this disclosure.

Referring to FIG. 2 and FIG. 4, the metallic bottom cover 200 for the integrated heat dissipation module structure 10 is schematically shown. In one embodiment of this disclosure, the integrated heat dissipation module structure 10 is characterized in which the conformation and structure features of the metallic bottom cover 200 are directly formed on the same piece of metal. Namely, the plurality of the supporting structures 224 and the screw-hole protrusion 225 on the inner evaporation surface 220 of the metallic bottom cover 200 are all directly formed, as a unique piece, from the same metal body, not by re-sintering or welding. In other words, in this embodiment of the present disclosure, the plurality of the supporting structures 224 and the screw-hole protrusion 225 included on the inner evaporation surface 220 of the integrated heat dissipation module structure 10 are directly formed on the inner evaporation surface without having any homogeneous or heterogeneous interfaces in between. In contrast to the regular prior arts, which the plurality of supporting structures 224 are formed on the inner evaporation surface by sintering.

Generally speaking, in producing the one-piece metallic top cover 100 and the metallic bottom cover 200 of the aforesaid integrated heat dissipation module structure of the present disclosure, an etching process or a combined machining process (for example, integrating a pressing or extrusion process with a milling process) can be used, following with the sintering process. The advantage of etching is that the workpiece can be processed to have complicated structures, and thus the etching process is generally applicable to a task that a traditional process can't work on. On the other hand, the advantage of the combined machining process is that all the involved steps can be achieved by mature arts, and no additional development work is required. Nevertheless, the etching process spends a prolong process time, and usually needs a secondary process to finish a possible unsmooth surface. On the other hand, the combined machining process needs both the labors and the time.

In one embodiment of this disclosure, a cold-forging process is applied to manufacture the metallic top cover 100 and the metallic bottom cover 200 of the integrated heat dissipation module structure 10. A CNC machining can also be applied for finer modification. In comparison to the etching process or the combined machining process, the cold-forging process is firstly to place a metal piece (or a metal block) into a female mode. Then, under the room temperature, a male mode is applied to repeatedly forge the metal within the female mode to form a final product. It shall be understood to the skilled in the art that the cold-forging process requires no preheating and annealing steps of a typical forging or pressing process, thus the thermal conductivity of the forged metal would not be reduced since the internal grain structure of the forged metal would not exist holes/voids and hypertrophy caused by the annealing. The cold-forged metal undergoes no heating process, thus the internal grain structure would maintain a quite dense situation, the holes or voids inside the forged metal can be greatly reduced, and the surface of the forged metal would be much smoother. In addition, rigidity and compactness of the forged metal would be further increased to reject possible deformation or distortion. After testing, the thermal conductivity and thermal diffusivity of the forged metal are higher than those of the pre-forged metal. Namely, the integrated heat dissipation module structure 10 in accordance with this disclosure can provide better heat-dissipating efficiency than that produced by the general traditional process.

In one embodiment of this disclosure, the metallic top cover 100 of the integrated heat dissipation module structure 10 is manufactured by cold-forging process, which is characterized that the shape and structure features of the metallic top cover 100 are directly made as a unique piece from a metal by a cold-forging process, including the plurality of the columnar heat dissipation structures 111 on the outer heat-dissipating surface 110 of the metallic top cover 100.

In one embodiment of this disclosure, the metallic bottom cover 200 of the integrated heat dissipation module structure 10 is manufactured by cold-forging process, which is characterized that the shape and structure features of the metallic bottom cover 200 are directly made as a unique piece from a metal body by a cold-forging process, which is characterized that the shape and structure features of the metallic bottom cover 200 are directly made as a unique piece from a metal by a cold-forging process, including the plurality of supporting structures 224 and the screw-hole protrusion 225. In other words, similar to the metallic top cover 100, the plurality of the supporting structures 224 on the inner evaporation surface 220 of the metallic bottom cover 200 are directly formed, as a unique piece, from the same metal body of the metallic bottom cover 200 by cold-forging, not by re-sintering or welding. In one embodiment of this disclosure, each of the plurality of the supporting structures 224 is a post.

In the embodiment of the integrated heat dissipation module structure according to this disclosure, the material for the metallic top cover 100 and the metallic bottom cover 200 is a metallic material with superior thermal conductivity and thermal diffusivity, such as pure copper, and, after the cold-forging process, the corresponding one-piece structure can be formed. In one embodiment, the metallic material used for producing the metallic top cover 100 and the metallic bottom cover 200 is pure copper.

It should be understood for the one skilled in the art that in the aforementioned embodiments, when the pure copper is used as material for producing the metallic top cover 100 and the metallic bottom cover 200 by cold-forging process, the pure copper material is firstly placed in the mold and followed by continuous forging on the pure copper material under room temperature during the process. Therefore, the physical properties of the metallic top cover 100 and metallic bottom cover 200 obtained by cold-forging process (such as Vickers hardness, thermal conductivity and thermal diffusivity, etc.) is higher than which obtained by other machining processes (such as etching, pressing, extrusion or regular forging processes), and also higher than that of the pure copper material without cold-forging processing. In other words, when the pure copper material has been through cold-forging process, the physical properties, such as Vickers hardness, thermal conductivity, and thermal diffusivity, are higher than that of the pure copper material being through other processing methods.

The following is one exemplary example disclosed in the other disclosure by the inventor of this disclosure. In this example, the metallic top cover and the metallic bottom cover of the vapor chamber are made of pure copper, and manufactured by the cold-forging process. After having an entrusted third party (the YUANHE company) to measure Vickers hardness, thermal conductivity and thermal diffusivity of the cold-forged metal, the results are listed in Table 1 as follows, in comparison to results by the traditional combined machining process such as a process having pressing and CNC machining steps. It should be understood by the one skilled in the art that the processed material will be endowed with higher physical properties such as Vickers hardness, thermal conductivity and thermal diffusivity, which can be attributed to the characteristic of cold-forging process. It should also be understood that the degrees of the raising improvement of the aforementioned physical properties of the material are depending on the numbers and force of repeated forging against on the material during the cold-forging process. In particular, the more the numbers and force of the forging are, the higher the physical properties would be. Thus, after the cold-forging process, the aforementioned physical properties would be superior to those provided by the traditional combined machining method.

TABLE 1

| | Cold-forging | Traditional combined machining |
| --- | --- | --- |
| Vickers hardness (HV) | 115~117 | 85~87 |
| Thermal conductivity (W/m · K) | about 430 | about 395 |
| Thermal diffusivity (mm²/sec) | 115~117 | 85~87 |

In one exemplary example, the material for producing the metallic top cover 100 and the metallic bottom cover 200 of the integrated heat dissipation module structure 10 in accordance with this disclosure is the pure copper with high thermal conductivity and thermal diffusivity. The cold-forged metallic top cover 100 and metallic bottom cover 200 would present the Vickers hardness not lower than 90 HV, 95 HV, 100 HV or 105 HV.

In another exemplary example, the material for producing the metallic top cover 100 and the metallic bottom cover 200 of the integrated heat dissipation module structure 10 in accordance with this disclosure is the pure copper with high thermal conductivity and thermal diffusivity. The cold-forged metallic top cover 100 and metallic bottom cover 200 would present the thermal conductivity not lower than 400 W/(m·K), 405 W/(m·K), 408 W/(m·K), or 410 W/(m·K).

In a further exemplary example, the material for producing the metallic top cover 100 and the metallic bottom cover 200 of the integrated heat dissipation module structure 10 in accordance with this disclosure is the pure copper with high thermal conductivity and thermal diffusivity. The cold-forged metallic top cover 100 and metallic bottom cover 200 would present the thermal diffusivity not smaller than 90 mm²/sec, 95 mm²/sec, 100 mm²/sec, or 105 mm²/sec.

Figure 5:
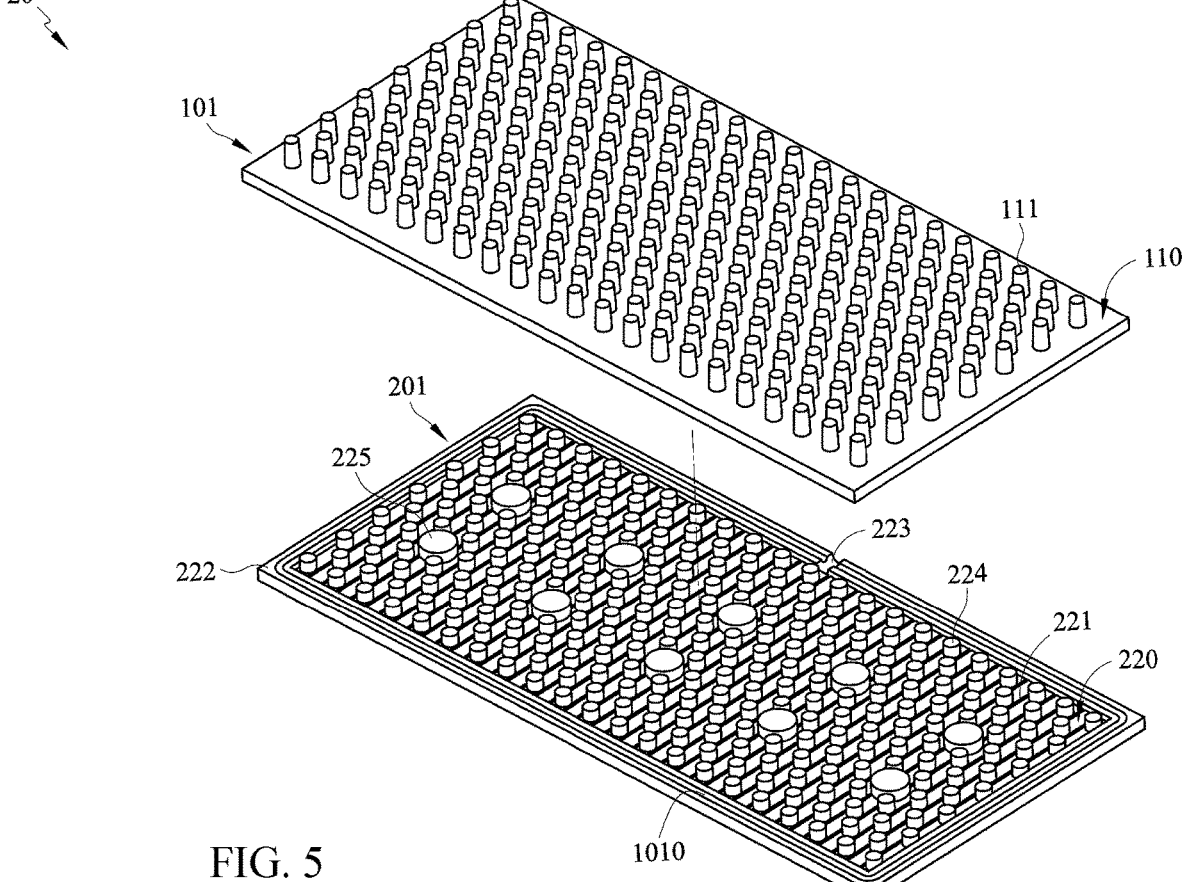
FIG. 5 shows schematically another embodiment of the heat dissipation module structure in accordance with this disclosure.
Figure 6:
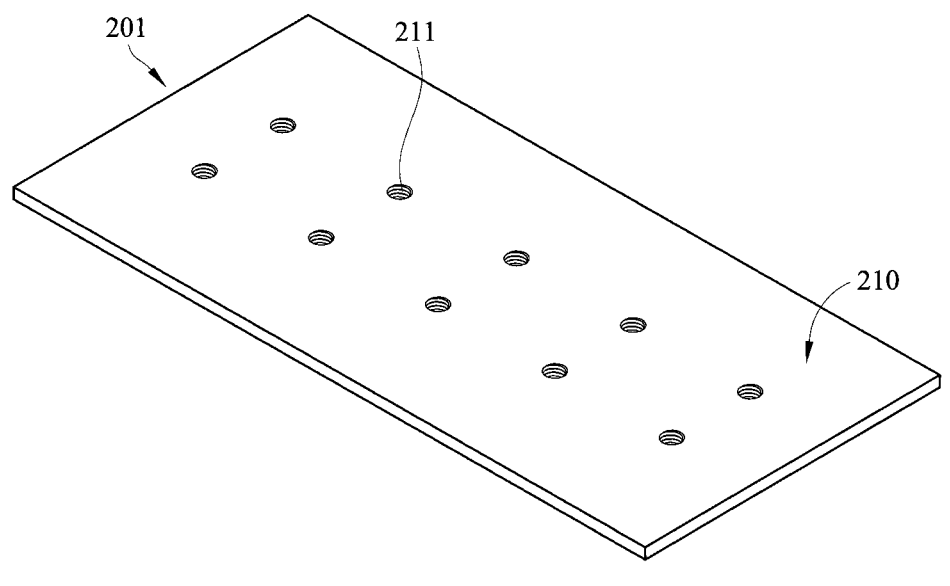
FIG. 6 shows schematically a metallic bottom cover of another embodiment of the integrated heat dissipation module structure in accordance with this disclosure.

Referring to the integrated heat dissipation module structure 20 in FIG. 5 and FIG. 6, which is another exemplary embodiment of the integrated heat dissipation module structure 10 in FIG. 1 of this disclosure. The outer heat-absorption surface 210 of the metallic bottom cover 201 further includes a plurality of screw holes 211 for locking multiple heat-generating elements being in contact with the outer heat-absorption surface 210. The plurality of screw holes 211 are recessed from the outer heat-absorption surface 210 to the inner evaporation surface 220, forming a plurality of screw-hole protrusions 225 without penetrating through. The height of the screw-hole protrusions 225 is not higher than the height of the supporting structures 224. In one embodiment, a plurality of heat-generating elements are locked on the outer heat-absorption surface 210 through the screw holes 211, contact between the heat-generating elements and the outer heat-absorption surface 210 can be perfect to enhance the heat-dissipating efficiency. Alternatively, a thermal conductive material with good thermal conductivity can also be inserted in between the heat-generating elements and the outer heat-absorption surface 210, such that the thermal resistance caused by uneven contact surfaces can be reduced. For example, the aforesaid thermal conductive material can include thermal pastes or graphite flakes.

In any of the aforementioned embodiment, the metallic top cover 100 or 101 and the metallic bottom cover 200 or 201 of the integrated heat dissipation module structure 10 or 20 in accordance with this disclosure are engaged firmly by welding.

In any of the aforementioned embodiment, the working fluid used in the integrated heat dissipation module structure 10 or 20 in accordance with this disclosure is pure water.

In any of the aforementioned embodiment, the working space 300 of the integrated heat dissipation module structure 10 or 20 in accordance with this disclosure, after vacuuming, has the air pressure less than $1\times10^{-3}$ torr, $1\times10^{-4}$ torr, or $1\times10^{-5}$ torr.

Figure 7:
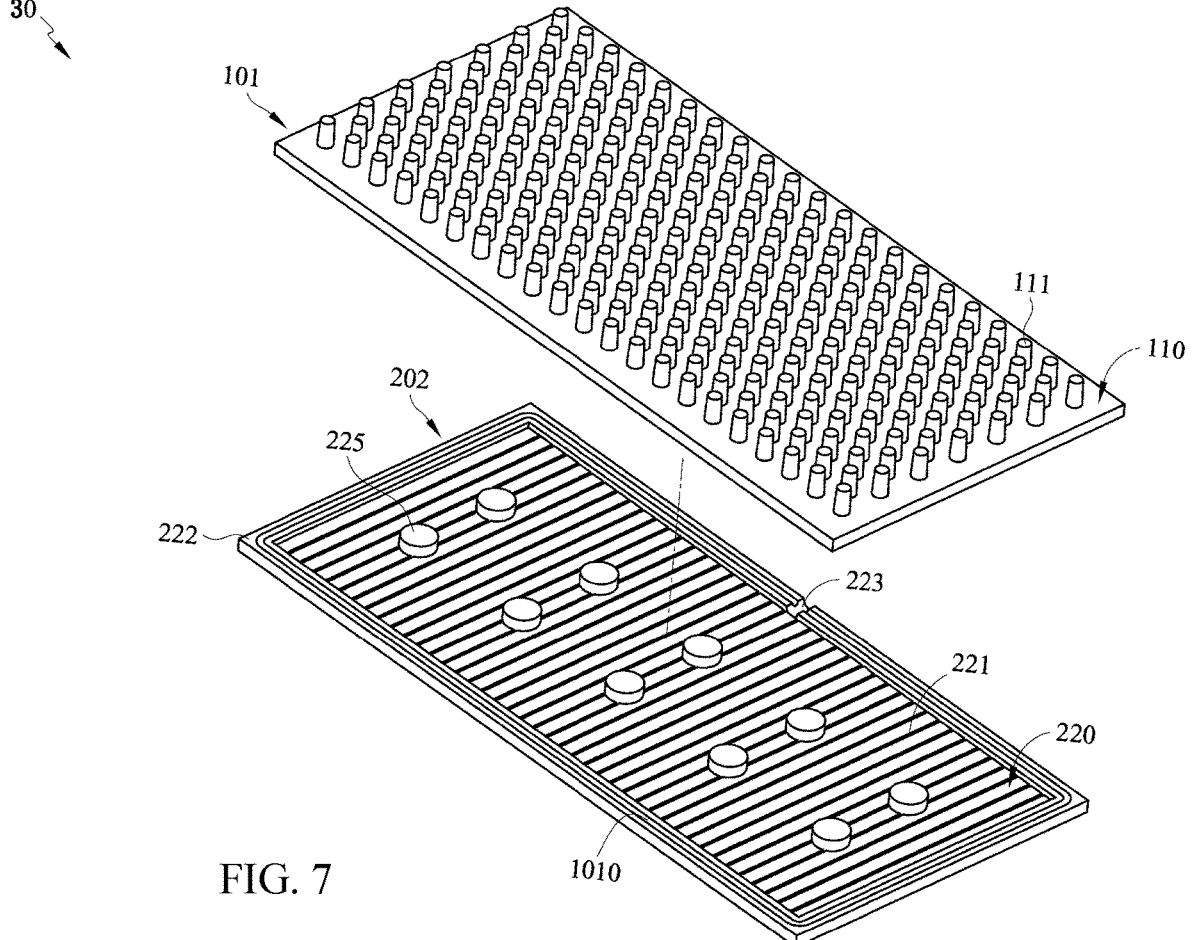
FIG. 7 shows schematically further another embodiment of the heat dissipation module structure in accordance with this disclosure.

Referring to FIG. 7, another exemplary embodiment of an integrated heat dissipation module structure 30 in accordance with this disclosure includes a metallic top cover 101, a metallic bottom cover 202, a working space 300, a vacuum channel 400, a plurality of capillary structures 500 and a working fluid. The metallic top cover 101 further includes oppositely an outer heat-dissipating surface 110 and an inner condensation surface 120. The outer heat-dissipating surface 110 has a plurality of columnar heat dissipation structures 111 protruding therefrom. The inner condensation surface 120 is surrounded by a top frame 122 with a predetermined height, and the top frame 122 is furnished with an upper communicative groove 123. The inner condensation surface 120 has thereon a plurality of top grooves 121 parallel to each other. The metallic bottom cover 202 includes oppositely an outer heat-absorption surface 210 and an inner evaporation surface 220. The outer heat-absorption surface 210 has thereon a plurality of screw holes 211 for locking multiple heat-generating elements. The inner evaporation surface 220 is surrounded by a bottom frame 222 with another predetermined height, and the bottom frame 222 is furnished with a lower communicative groove 223. The inner evaporation surface 220 has thereon a plurality of bottom grooves 221 parallel to each other and a plurality of screw-hole protrusions 225 corresponding to the plurality of screw holes 221. The screw-hole protrusions 225 are formed by recessing from the outer heat-absorption surface 210 to the inner evaporation surface 220 and protruding from the inner evaporation surface 220 but not penetrating through. The working space 300 is an airtight space formed by engaging the top frame 122 of the metallic top cover 101 and the bottom frame 222 of the metallic bottom cover 202 with the inner condensation surface 120 of the metallic top cover 101 to face the inner evaporation surface 220 of the metallic bottom cover 202 and the plurality of top grooves 121 to overlap individually the plurality of bottom grooves 221. The plurality of screw-hole protrusions 225 are protruding from the inner evaporation surface 220 to contact individually at the inner condensation surface 120 and providing support to the working space 300. The vacuum channel 400 is formed by connecting spatially the upper communicative groove 123 and the lower communicative groove 223 so as provide a channel for vacuuming the working space 300. The plurality of capillary structures 500 are disposed individually inside the plurality of bottom grooves 221 or both top grooves 121 and bottom grooves 221. The working fluid is in the working space 300 and the plurality of capillary structures 500.

In one embodiment of the integrated heat dissipation module structure 30 according to this disclosure, the entire structure of the metallic top cover 101 including the columnar heat dissipation structures 111 is made as a unique piece from the same metal body. In addition, the entire structure of the metallic bottom cover 202 including the plurality of screw-hole protrusions 225 is made as a unique piece from the same metal body.

In one embodiment of the integrated heat dissipation module structure 30 according to this disclosure, the number of the screw holes 211 is not less than 10, and the accompanied with correspondingly the same number of screw-hole protrusions 225.

In one embodiment of the integrated heat dissipation module structure 30 according to this disclosure, the metallic top cover 101 and the metallic bottom cover 202 are made of pure copper.

In one embodiment of the integrated heat dissipation module structure 30 according to this disclosure, the metallic top cover 101 and the metallic bottom cover 202 are engaged firmly by welding.

In one embodiment of the integrated heat dissipation module structure 30 according to this disclosure, the working fluid used is pure water.

In one embodiment of the integrated heat dissipation module structure 30 according to this disclosure, the working space 300 has the air pressure less than $1\times10^{-3}$ torr, $1\times10^{-4}$ torr or $1\times10^{-5}$ torr after vacuuming.

Certainly, each of the above-mentioned embodiments is only for illustration and not limiting the scope of the present disclosure, and any equivalent modification or change made according to the integrated heat dissipation module structure of the above-mentioned embodiments shall still be included in the patent scope of the present disclosure.

It is worth mentioning that most of the existing heat dissipation modules adopt external heat sinks. Such a combined module structure would have an additional thermal resistance attributed to the heterogeneous heat conduction interface prior to the heat sink, leading to reducing the efficiency of the heat dissipation module. The integrated heat dissipation module structure according to this disclosure integrates the metallic top cover of the vapor chamber and the heat sink structure into one unique piece, so that the heat dissipation efficiency of the vapor chamber is not restricted by the thermal resistance of the conduction interface, and hence the heat dissipation efficiency is improved. Additionally, the integrated heat dissipation module structure of this disclosure can be made by cold-forging process in addition to regular etching process or combined machining process. The cold-forging process can endow the processed material with finer grain structure and reduce internal defects such as holes/voids, so that the material can obtain higher strength, deformation resistance and fatigue resistance. Also, the thermal conductivity and thermal diffusion efficiency of the material can be improved. Thereupon, the resulted integrated heat dissipation module structure would be superior to general heat dissipation modules with similar structures in terms of heat dissipation efficiency, durability and reliability.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. An integrated heat dissipation module structure, comprising:

a metallic top cover, including oppositely an outer heat-dissipating surface and an inner condensation surface, the outer heat-dissipating surface having a plurality of columnar heat dissipation structures protruding therefrom, the inner condensation surface being surrounded by a top frame with a predetermined height, the top frame being furnished with an upper communicative groove, the inner condensation surface having thereon a plurality of top grooves parallel to each other;

a metallic bottom cover, including oppositely an outer heat-absorption surface and an inner evaporation surface, the outer heat-absorption surface having thereon a screw hole for locking at least one heat-generating element, the inner evaporation surface being surrounded by a bottom frame with another predetermined height, and the bottom frame is furnished with a lower communicative groove, the inner evaporation surface having thereon a plurality of bottom grooves parallel to each other, a plurality of supporting structures protruding therefrom and disposed individually among the plurality of bottom grooves, and a screw-hole protrusion corresponding to the screw hole, the screw-hole protrusion recessed into the outer heat-absorption surface toward the inner evaporation surface and protruding from the inner evaporation surface but not penetrating through, the screw-hole protrusion being not higher than the supporting structures;

a working space, being an airtight space formed by engaging the top frame of the metallic top cover and the bottom frame of the metallic bottom cover with the inner condensation surface of the metallic top cover to face the inner evaporation surface of the metallic bottom cover, the plurality of top grooves to overlap individually the plurality of bottom grooves, the plurality of supporting structures protruding from the inner evaporation surface to contact individually at the inner condensation surface among the plurality of top grooves and providing support to the working space;

a vacuum channel being formed by connecting spatially the upper communicative groove and the lower communicative groove so as provide a channel for vacuuming the working space;

a plurality of capillary structures, disposed individually inside the plurality of bottom grooves or both top grooves and bottom grooves; and a working fluid, being in the working space and the plurality of capillary structures;

wherein the metallic top cover and the plurality of columnar heat dissipation structures are part of a single body made of metal, and the metallic bottom cover, the plurality of supporting structures, and the screw-hole protrusions are part of another single body made of metal.

2. The integrated heat dissipation module structure of claim 1, wherein the metallic top cover and the plurality of columnar heat dissipation structures are made as a unified piece from the single body made of metal by a cold-forging process, and the metallic bottom cover, the plurality of supporting structures, and the screw-hole protrusions are also made as a unified piece from the another single body made of metal by the cold-forging process.

3. The integrated heat dissipation module structure of claim 2, wherein the metal is pure copper.

4. The integrated heat dissipation module structure of claim 2, wherein the metal is pure copper, and each of the metallic top cover and the metallic bottom cover has Vickers hardness not lower than 90 HV.

5. The integrated heat dissipation module structure of claim 2, wherein the metal is pure copper, and each of the metallic top cover and the metallic bottom cover has thermal conductivity not lower than 400 W/(m-K).

6. The integrated heat dissipation module structure of claim 2, wherein the metal is pure copper, and each of the metallic top cover and the metallic bottom cover has thermal diffusivity not smaller than 90 mm$^2$/sec.

7. The integrated heat dissipation module structure of claim 2, wherein each of the plurality of supporting structures is a post.

8. The integrated heat dissipation module structure of claim 2, wherein the metallic top cover and the metallic bottom cover are engaged firmly by welding.

9. The integrated heat dissipation module structure of claim 2, wherein the working fluid is pure water.

10. The integrated heat dissipation module structure of claim 2, wherein an air pressure of the working space is less than 1×10$^{-3}$ torr.

11. The integrated heat dissipation module structure of claim 1, wherein the outer heat-absorption surface of the metallic bottom cover further includes a plurality of screw holes and a plurality of screw-hole protrusions corresponding to the plurality of screw holes, the plurality of screw-hole protrusions recessed into the outer heat-absorption surface toward the inner evaporation surface and protruding therefrom the inner evaporating surface without penetrating through, the plurality of the screw-hole protrusions being not higher than the supporting structures.

12. An integrated heat dissipation module structure, comprising:

a metallic top cover, including oppositely an outer heat-dissipating surface and an inner condensation surface, the outer heat-dissipating surface having a plurality of columnar heat dissipation structures protruding therefrom, the inner condensation surface being surrounded by a top frame with a predetermined height, the top frame being furnished with an upper communicative groove, the inner condensation surface having thereon a plurality of top grooves parallel to each other;

a metallic bottom cover, including oppositely an outer heat-absorption surface and an inner evaporation surface, the outer heat-absorption surface having thereon a plurality of screw holes for locking a plurality of heat-generating elements, the inner evaporation surface being surrounded by a bottom frame with another predetermined height, and the bottom frame is furnished with a lower communicative groove, the inner evaporation surface having thereon a plurality of bottom grooves parallel to each other and a plurality of screw-hole protrusions corresponding to the plurality of screw holes, the screw-hole protrusions recessed into the outer heat-absorption surface toward the inner evaporation surface and protruding from the inner evaporation surface but not penetrating through the outer heat-absorption surface and the inner evaporation surface;

a working space, being an airtight space formed by engaging the top frame of the metallic top cover and the bottom frame of the metallic bottom cover with the inner condensation surface of the metallic top cover to face the inner evaporation surface of the metallic bottom cover, the plurality of top grooves to overlap individually the plurality of bottom grooves, the plurality of screw-hole protrusions protruding from the inner evaporation surface to contact individually at the inner condensation surface and providing support to the working space;

a vacuum channel being formed by connecting spatially the upper communicative groove and the lower communicative groove so as provide a channel for vacuuming the working space;

a plurality of capillary structures, disposed individually inside the plurality of bottom grooves or both top grooves and bottom grooves; and a working fluid, being in the working space and the plurality of capillary structures;

wherein the metallic top cover and the plurality of columnar heat dissipation structures are part of a single body made of metal, and the metallic bottom cover, the plurality of supporting structures, and the plurality of screw-hole protrusions are part of another single body made of metal.

13. The integrated heat dissipation module structure of claim 12, wherein there are at least 10 of the screw holes corresponding to the same number of the screw-hole protrusions.

14. The integrated heat dissipation module structure of claim 12, wherein both the metallic top cover and the metallic bottom cover are made of copper.

15. The integrated heat dissipation module structure of claim 12, wherein the metallic top cover and the metallic bottom cover are engaged firmly by welding.

16. The integrated heat dissipation module structure of claim 12, wherein the working fluid is pure water.

17. The integrated heat dissipation module structure of claim 12, wherein an air pressure of the working space is less than 1×10$^{-3}$ torr.

* * * * *